United States Patent
Kodera et al.

(10) Patent No.: US 10,256,314 B2
(45) Date of Patent: Apr. 9, 2019

(54) SEMICONDUCTOR DEVICE

(71) Applicant: KABUSHIKI KAISHA TOSHIBA, Tokyo (JP)

(72) Inventors: Masako Kodera, Kanazawa Ishikawa (JP); Tomoko Matsudai, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 13 days.

(21) Appl. No.: 15/247,918

(22) Filed: Aug. 26, 2016

(65) Prior Publication Data

US 2017/0263724 A1 Sep. 14, 2017

(30) Foreign Application Priority Data

Mar. 11, 2016 (JP) .................. 2016-048901

(51) Int. Cl.
*H01L 29/423* (2006.01)
*H01L 29/20* (2006.01)
(Continued)

(52) U.S. Cl.
CPC .... *H01L 29/42376* (2013.01); *H01L 29/0619* (2013.01); *H01L 29/2003* (2013.01);
(Continued)

(58) Field of Classification Search
CPC ........... H01L 29/2003; H01L 29/66462; H01L 29/7787; H01L 29/401; H01L 29/205;
(Continued)

(56) References Cited

U.S. PATENT DOCUMENTS 8,716,141 B2  5/2014  Dora et al.
8,890,211 B1* 11/2014  Mayo ................ H01L 21/28593
                                                                257/192
2011/0057272 A1* 3/2011  Kurahashi ......... H01L 21/28587
                                                                257/410

FOREIGN PATENT DOCUMENTS

JP  2014511032 A  5/2014
JP  2015023061 A  2/2015
(Continued)

OTHER PUBLICATIONS

Zhang et al., Chin. Phys. B vol. 22, No. 5, 2013, 057304, http://www.semiconductor-today.com/news_items/2014/SEP/MIT_020914.shtml.

*Primary Examiner* — Cuong B Nguyen
(74) *Attorney, Agent, or Firm* — Kim & Stewart LLP

(57) ABSTRACT

A semiconductor device includes a first semiconductor layer, a first electrode above and electrically connected to the first semiconductor layer, a second electrode above the first semiconductor layer and electrically connected to the first semiconductor layer, a first insulating layer above the first semiconductor layer between the first and second electrodes, and a third electrode. The second electrode is spaced from the first electrode along the first semiconductor layer. The third electrode includes a first portion above the first insulating layer between the first and second electrodes, and a second portion between the first portion and the second electrode and extending from the first portion in the direction of, and spaced from, the second electrode. The distance between the first semiconductor layer and an adjacent curved surface of the second portion gradually increases from the first portion to the end of the second portion distal the first portion.

15 Claims, 14 Drawing Sheets

(51) Int. Cl.
| | | |
|---|---|---|
| *H01L 29/205* | (2006.01) | |
| *H01L 29/40* | (2006.01) | |
| *H01L 29/66* | (2006.01) | |
| *H01L 29/778* | (2006.01) | |
| *H01L 29/78* | (2006.01) | |
| *H01L 29/861* | (2006.01) | |
| *H01L 29/06* | (2006.01) | |
| *H01L 29/739* | (2006.01) | |

(52) U.S. Cl.
 CPC ......... *H01L 29/205* (2013.01); *H01L 29/401* (2013.01); *H01L 29/402* (2013.01); *H01L 29/404* (2013.01); *H01L 29/66462* (2013.01); *H01L 29/7397* (2013.01); *H01L 29/7786* (2013.01); *H01L 29/7787* (2013.01); *H01L 29/7811* (2013.01); *H01L 29/7813* (2013.01); *H01L 29/8611* (2013.01); *H01L 29/0638* (2013.01)

(58) Field of Classification Search
 CPC ..... H01L 21/823437; H01L 21/823456; H01L 21/823828; H01L 21/82385; H01L 27/14614; H01L 29/1033
 See application file for complete search history.

(56) References Cited

FOREIGN PATENT DOCUMENTS

| JP | 2015079922 A | 4/2015 |
|---|---|---|
| JP | 2015153884 A | 8/2015 |

\* cited by examiner

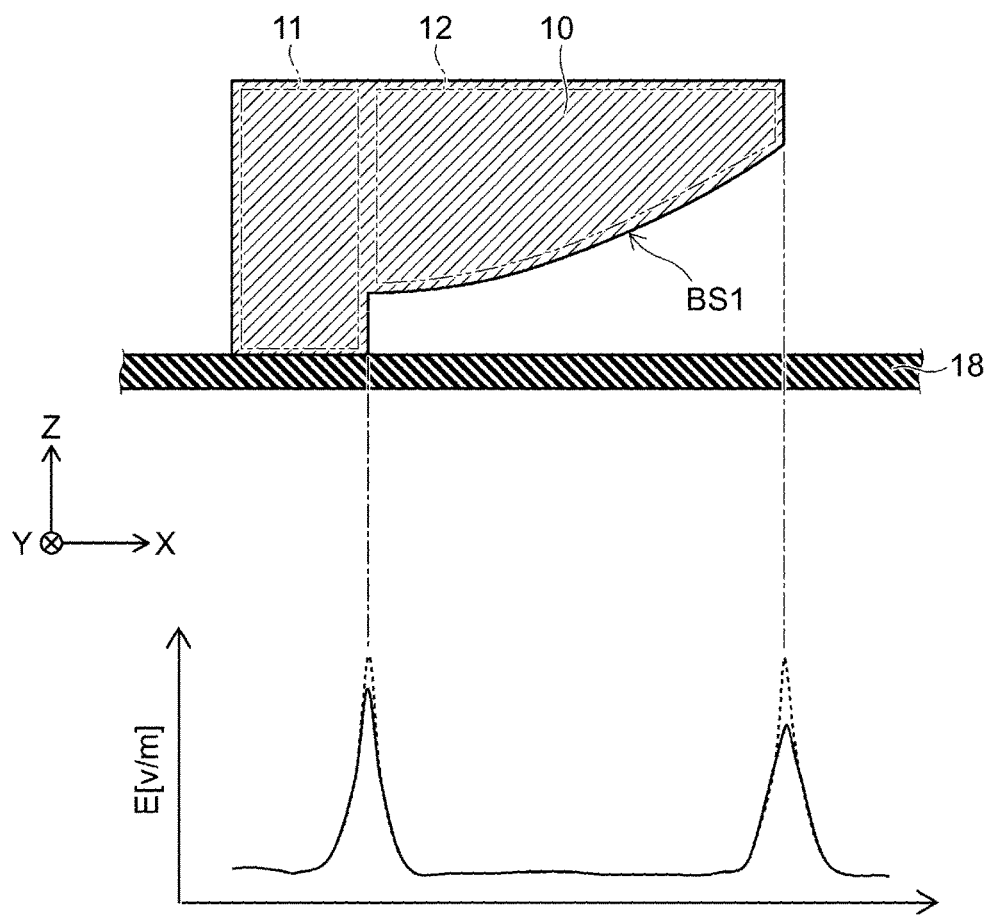

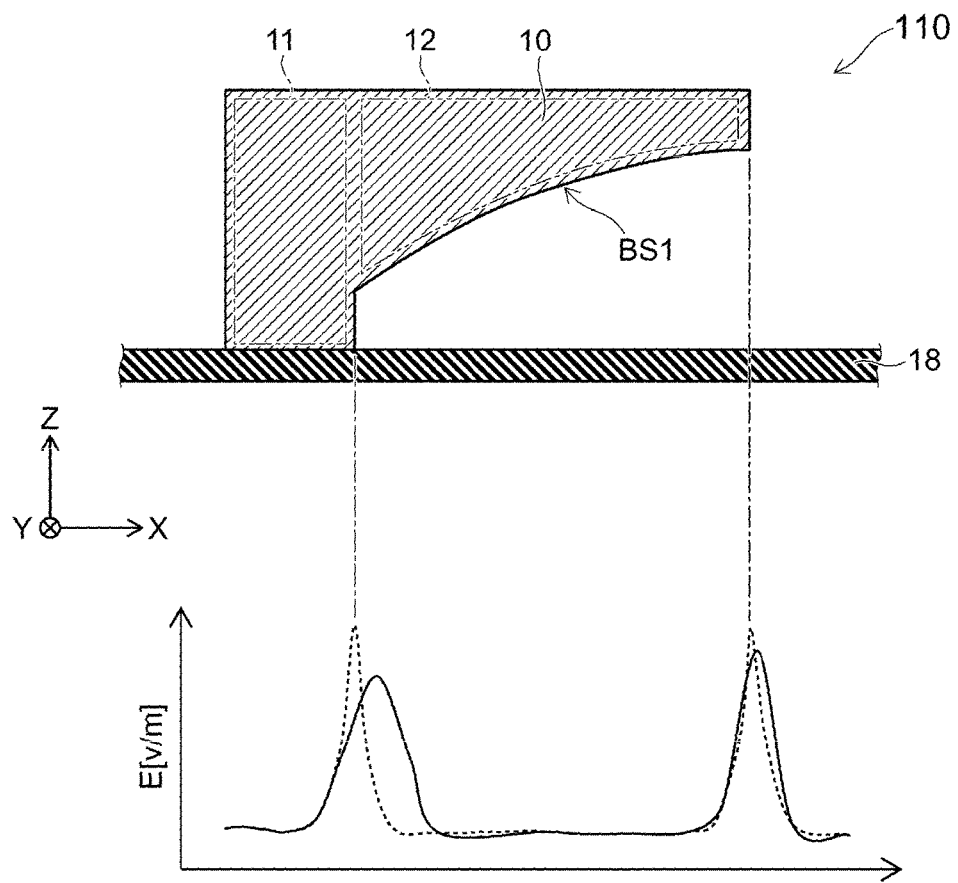

FIG. 8A
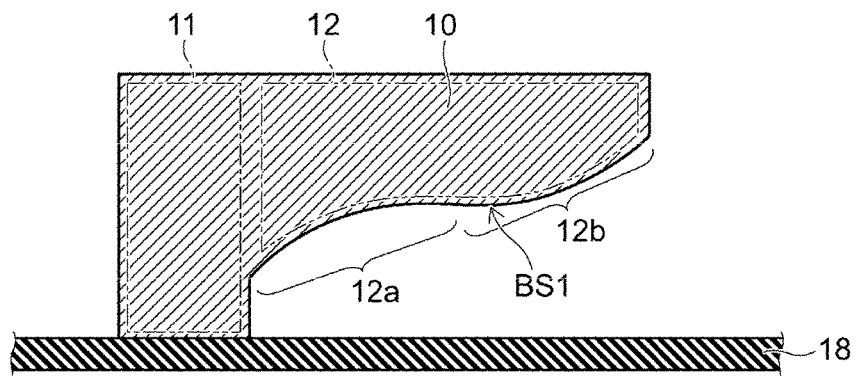
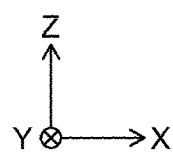
FIG. 8B
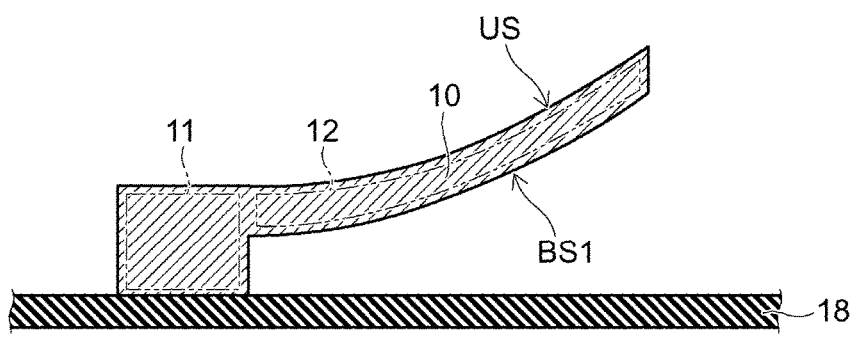
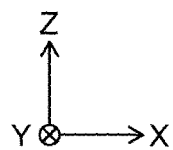

SEMICONDUCTOR DEVICE

CROSS-REFERENCE TO RELATED APPLICATION

This application is based upon and claims the benefit of priority from Japanese Patent Application No. 2016-048901, filed Mar. 11, 2016, the entire contents of which are incorporated herein by reference.

FIELD

Embodiments described herein relate generally to a semiconductor device.

BACKGROUND

To achieve high-efficient power conversion, application of power electronics and power semiconductor development are actively carried out. To handle wide rated voltages and currents, various elements have been developed. Use purposes and elements to be used are determined depending on switching frequencies and power capacities. As representative elements, there are semiconductor devices such as metal oxide semiconductor field effect transistors (MOSFET) suitable for high-frequency operations and insulated gate bipolar transistors (IGBT), which are bipolar elements capable of high breakdown resistance and large current capacity, and pin diodes. In such semiconductor devices, operability, high breakdown resistance, and the like are necessary along with low-loss driving, and thus a high breakdown resistance design is an important design factor.

DESCRIPTION OF THE DRAWINGS

FIG. 5 is an enlarged sectional view illustrating the vicinity of a gate electrode of the semiconductor device and a graph illustrating electric field strength in the vicinity of the gate electrode according to the first embodiment.

FIG. 6 is an enlarged sectional view illustrating the vicinity of a gate electrode of a semiconductor device and a graph illustrating electric field strength in the vicinity of the gate electrode according to a first modification example of the first embodiment.

FIGS. 8A and 8B are partially enlarged sectional views illustrating the vicinity of a gate electrode included in a semiconductor device according to other modification examples of the first embodiment.

DETAILED DESCRIPTION

Figure 1:
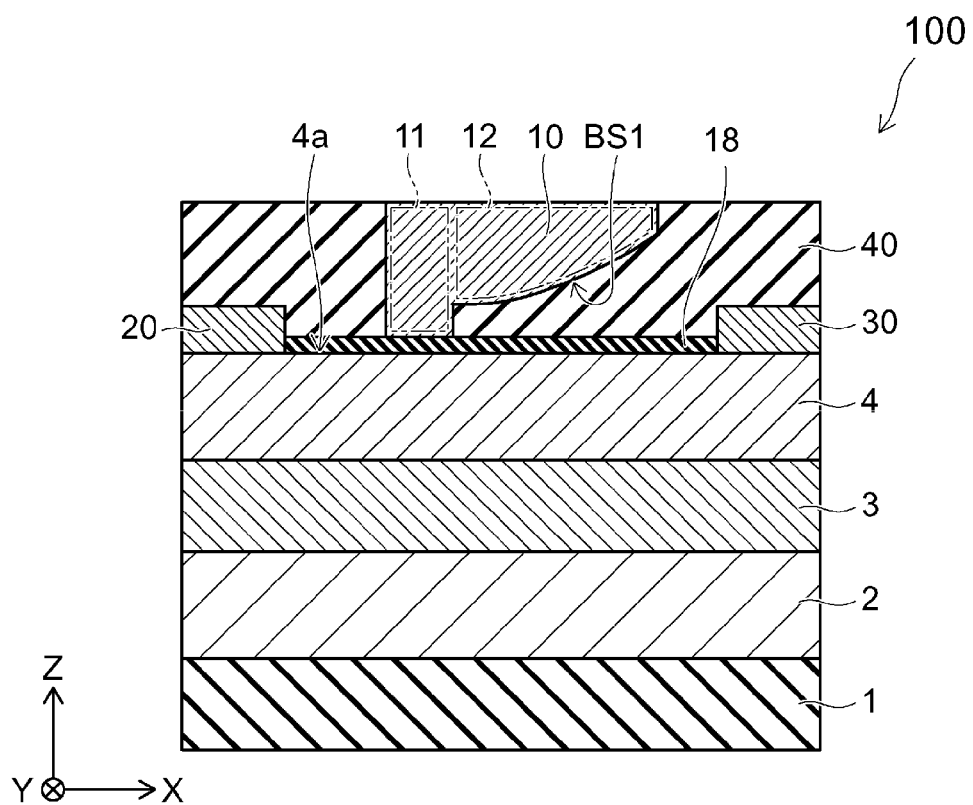
FIG. 1 is a sectional view illustrating a portion of a semiconductor device according to a first embodiment.

According to one embodiment, a semiconductor device includes a first semiconductor layer, a first electrode above the first semiconductor layer and electrically connected to the first semiconductor layer, a second electrode above the first semiconductor layer and electrically connected to the first semiconductor layer, the second electrode spaced from the first electrode along the first semiconductor layer, a first insulating layer above the first semiconductor layer between the first and the second electrodes, and a third electrode. The third electrode includes a first portion above the first insulating layer in a location between the first and the second electrodes, and a second portion between the first portion and the second electrode and extending from the first portion in the direction of, and spaced from, the second electrode. The distance between the first semiconductor layer and an adjacent curved surface of the second portion gradually increases from the first portion to the end of the second portion distal the first portion.

Hereinafter, embodiments will be described with reference to the drawings.

The drawings are schematic and conceptual, and relationships between the thicknesses and widths of respective portions, ratios between the sizes of the portions, and the like may not be the same as the actual relationships and ratios in an actual device. Even when the same portions are indicated, dimensions or ratios may be sometimes different depending on the drawings.

In this disclosure, the same reference numerals are given to elements which are the same as those already described and a detailed description thereof will not be repeated where appropriate.

First Embodiment

FIG. 1 is a sectional view illustrating a portion of a semiconductor device 100 according to a first embodiment.

The semiconductor device 100 is, for example, a horizontal high electron mobility transistor (HEMT).

As illustrated in FIG. 1, the semiconductor device 100 includes a substrate 1, a buffer layer 2, a channel layer 3, a barrier layer 4 (first semiconductor layer), a gate electrode 10, a gate insulation layer 18, a source electrode 20 (first electrode), a drain electrode 30 (second electrode), and an insulation layer 40.

In the following description of the first embodiment, a direction oriented in the direction from the source electrode 20 to the drain electrode 30 is referred to as an X direction (first direction). A direction intersecting an upper surface 4a of the barrier layer 4 is referred to as a Z direction (second direction) and a direction perpendicular to the X and Z directions is referred to as a Y direction.

The buffer layer 2 is formed on the substrate 1. The buffer layer 2 is formed to alleviate lattice mismatch between the substrate 1 and the channel layer 3.

The channel layer 3 is formed on the buffer layer 2.

The barrier layer 4 is formed on the channel layer 3. The band gap of the barrier layer 4 is greater than the band gap of the channel layer 3. The channel layer 3 and the barrier layer 4 form a heterojunction interface and two-dimensional electron gas is generated on the heterojunction interface.

The source electrode 20 and the drain electrode 30 are formed on the upper surface 4a of the barrier layer 4 and spaced from each other. The source electrode 20 and the drain electrode 30 are in ohmic contact with the barrier layer 4.

The gate electrode 10 is formed above the upper surface 4a of the barrier layer 4 with the gate insulation layer 18 interposed therebetween. The gate electrode 10 is located between the source electrode 20 and the drain electrode 30 and spaced from both of those electrodes.

The insulation layer 40 is located around the gate electrode 10 and covers the source electrode 20 and the drain electrode 30.

Here, the structure of the gate electrode 10 will be described more specifically.

As illustrated in FIG. 1, the gate electrode 10 includes a first portion 11 and a second portion 12.

The first portion 11 is formed on the gate insulation layer 18 above the upper surface 4a.

The second portion 12 is formed between the first portion 11 and the drain electrode 30 and extends in the X direction. The distance between the second portion 12 and the barrier layer 4 in the Z direction is longer than the distance between the first portion 11 and the barrier layer 4 in the Z direction. The distance between the barrier layer 4 and a lower surface BS1 of the second portion 12 becomes gradually longer in the Z direction as one views the second portion along the X direction toward the drain electrode 30 from the first portion 11.

The lower surface BS1 of the second portion 12 has a curvature. Specifically, the lower surface BS1 is curved so as to have a convex shape projecting outwardly in the direction of the barrier layer 4 and an inclination angle of the lower surface BS1 with respect to the Z direction becomes gradually smaller as the lower surface is viewed along the X direction moving toward the drain electrode 30. In other words, the distance between the lower surface BS1 and the barrier layer 4 in the Z direction becomes gradually longer in the +X direction and the distance is larger toward the +X direction.

Next, examples of materials of the constituent elements of the semiconductor device 100 will be described.

The substrate 1 is formed of silicon, silicon carbide, or sapphire.

The buffer layer 2 has a structure in which a plurality of aluminum gallium nitride layers are stacked.

The channel layer 3 contains undoped gallium nitride.

The barrier layer 4 contains undoped aluminum gallium nitride.

The gate electrode 10, the source electrode 20, and the drain electrode 30 contain metal such as aluminum, nickel, copper, or titanium.

The gate insulation layer 18 contains an insulation material such as aluminum nitride or aluminum oxide.

The insulation layer 40 contains an insulation material such as silicon oxide.

Next, an example of a method of manufacturing the semiconductor device 100 according to the first embodiment will be described.

FIGS. 2A to 4B are sectional views illustrating the result of the process steps in the manufacturing of the semiconductor device 100 according to the first embodiment.

Figure 2A:
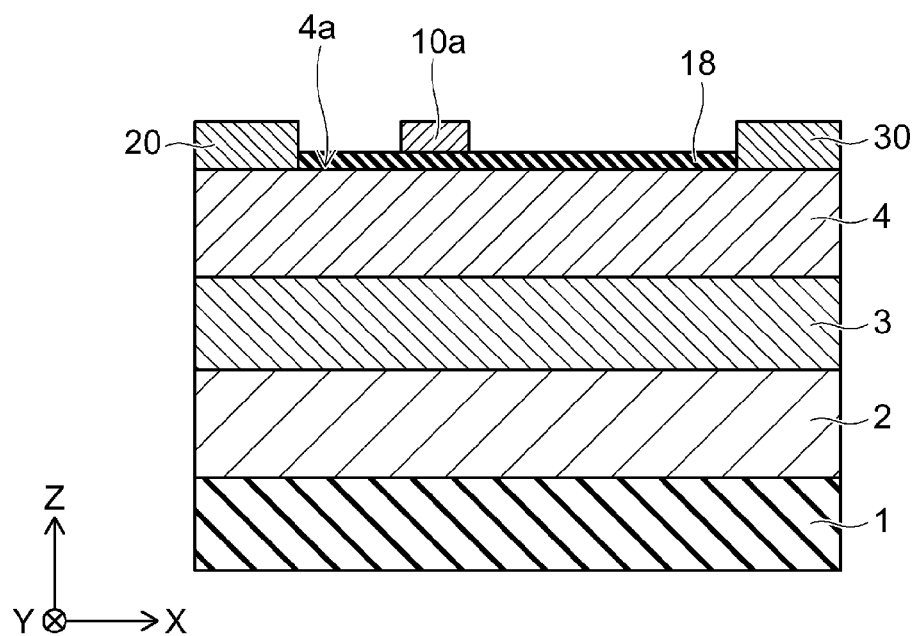
FIGS. 2A and 2B are sectional views illustrating processes of manufacturing the semiconductor device according to the first embodiment.
Figure 2B:
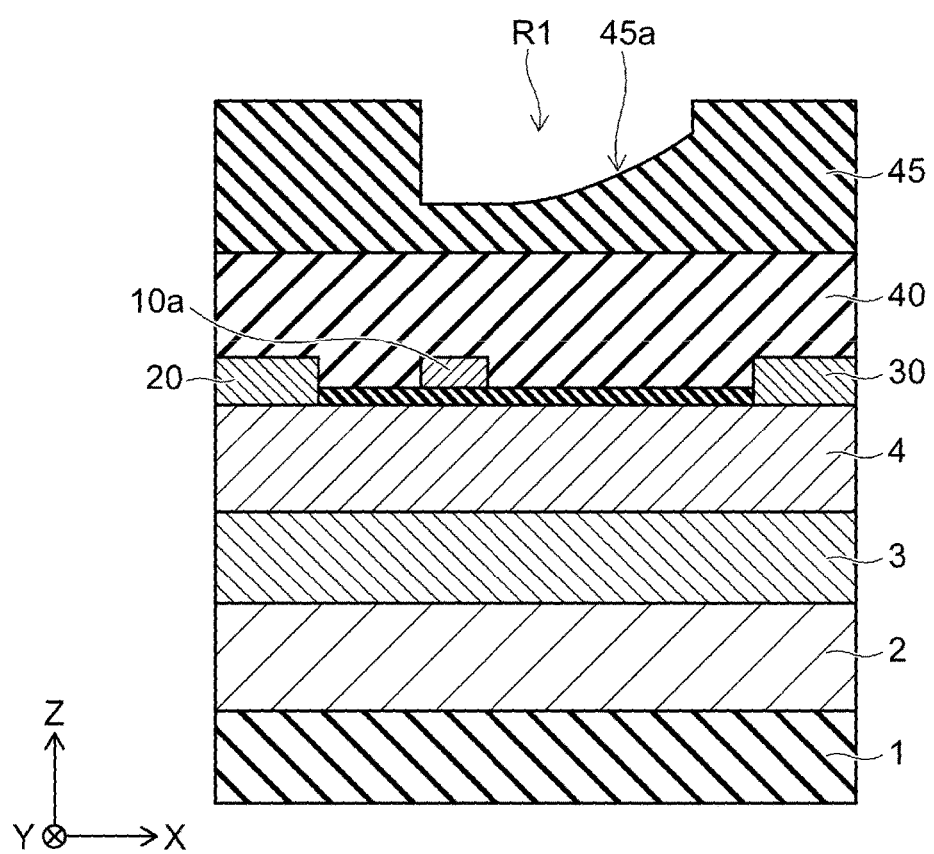

First, the buffer layer 2, the channel layer 3, and the barrier layer 4 are sequentially epitaxially grown on the substrate 1. Next, the gate insulation layer 18 is formed on the upper surface 4a of the barrier layer 4. Subsequently, a portion of the gate insulation layer 18 is removed to expose a portion of the upper surface 4a. Subsequently, a metal layer covering the gate insulation layer 18 and the exposed portions of the barrier layer 4 is formed. As illustrated in FIG. 2A, a gate electrode 10a which forms a portion of the gate electrode 10, the source electrode 20, and the drain electrode 30 are formed by patterning the metal layer.

Next, the insulation layer 40 covering the gate electrode 10a, the source electrode 20, and the drain electrode 30 are formed. Subsequently, a photoresist layer 45 is formed above the insulation layer 40 and a first concave portion R1 is formed in the photoresist layer 45 using a nanoimprint method. At this time, the first concave portion R1 is formed above the gate electrode 10a. A portion of a bottom surface 45a of the first concave portion R1 has a curvature and is curved so as to have a convex profile at the base thereof facing the buffer layer, as in the lower surface BS1 of the second portion 12 illustrated in FIG. 1.

Figure 3A:
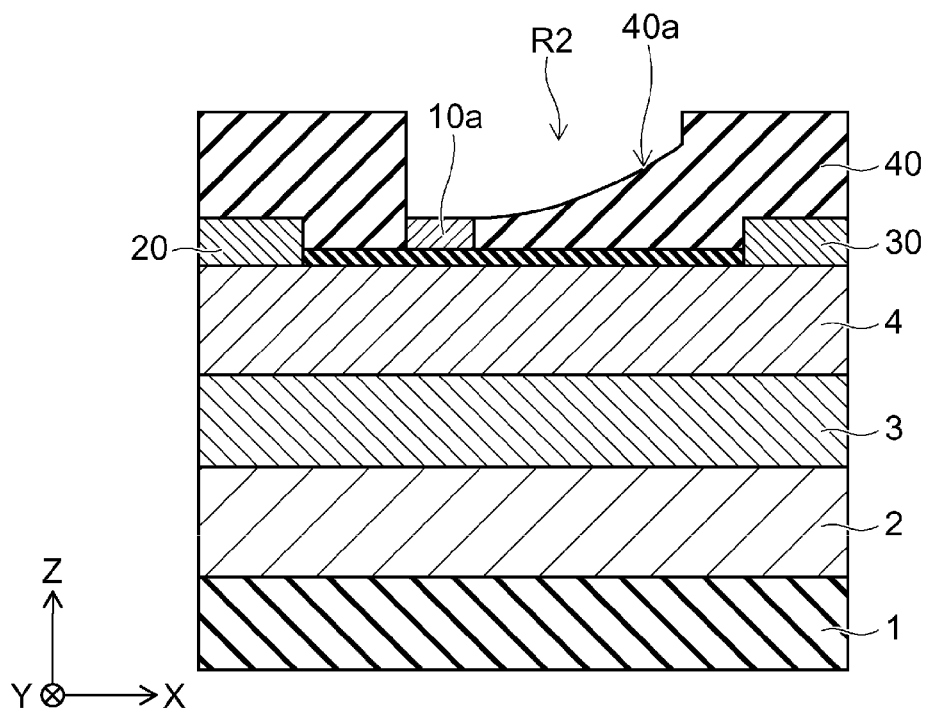
FIGS. 3A and 3B are sectional views illustrating processes of manufacturing the semiconductor device according to the first embodiment.

Next, a portion of the insulation layer 40 is removed using the photoresist layer 45 as a mask by anisotropic etching such as a reactive ion etching (RIE) method. By this process, the shape of the first concave portion R1 formed in the photoresist layer 45 is transferred to the insulation layer 40, and thus a second concave portion R2 is formed in the insulation layer 40, as illustrated in FIG. 3A. At this time, the upper surface of the gate electrode 10a is exposed at the base of the second concave portion R2. At least a portion of the bottom surface 40a of the second concave portion R2 has a curvature, having substantially the same configuration as the bottom surface 45a of the first concave portion R1.

Figure 3B:
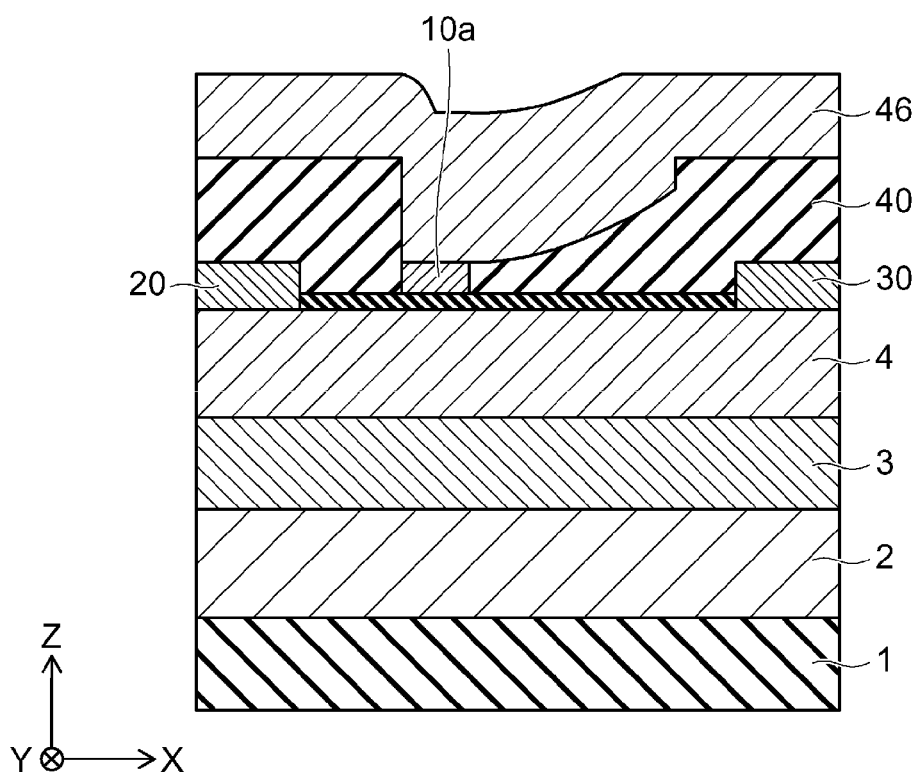

Next, as illustrated in FIG. 3B, a metal layer 46 is formed above the insulation layer 40 to fill and cover the second concave portion R2.

Figure 4A:
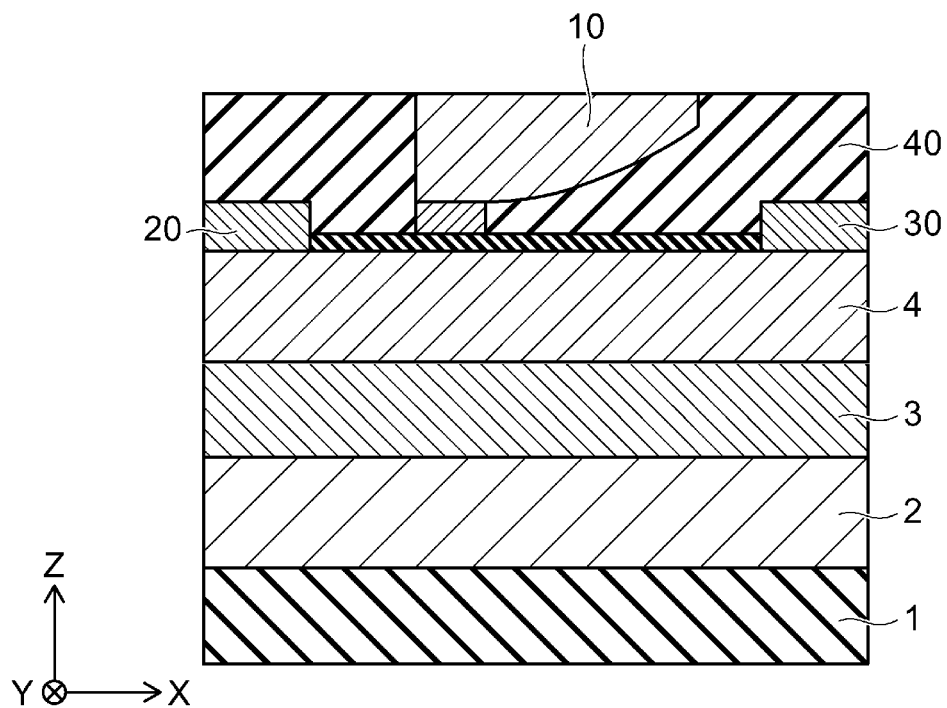
FIGS. 4A and 4B are sectional views illustrating processes of manufacturing the semiconductor device according to the first embodiment.

Subsequently, as illustrated in FIG. 4A, the metal layer 46 which is an excess stacked above the insulation layer 40 is removed by performing chemical mechanical polishing (CMP) to form the gate electrode 10 in the second concave portion R1 having a flat upper surface. Accordingly, the semiconductor device 100 illustrated in FIG. 1 can be formed.

Figure 4B:
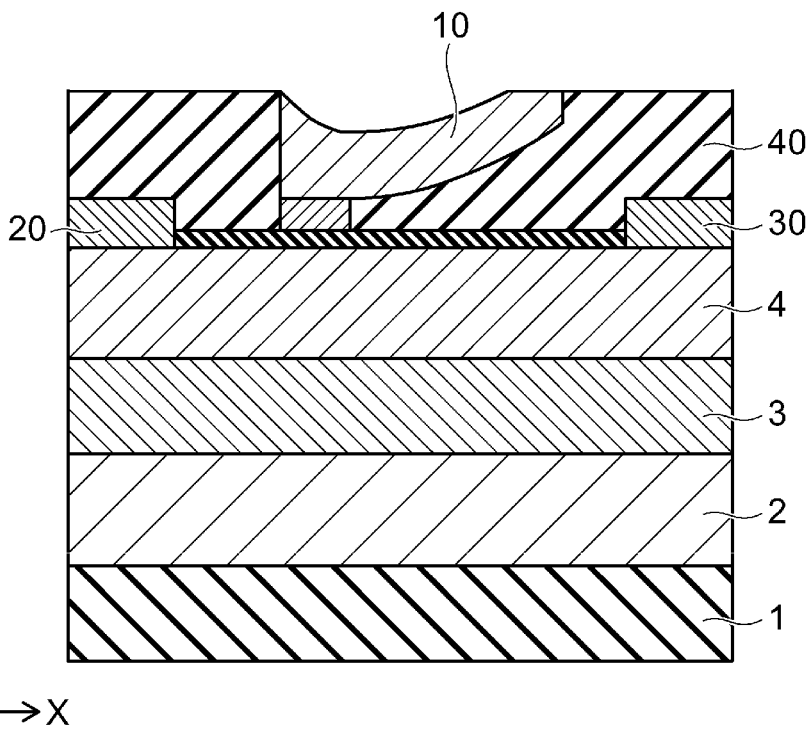

Alternatively, the portion of the metal layer 46 extending above the photoresist layer 40 may be etched back to remove the excess portion of the metal layer. In this case, as illustrated in FIG. 4B, a pit or recess is formed on the upper surface of the gate electrode 10.

Here, operations and advantages according to the present embodiment will be described with reference to FIG. 5.

FIG. 5 is an enlarged sectional view illustrating the vicinity of the gate electrode 10 of the semiconductor device 100 and a graph illustrating electric field strength in the vicinity of the gate electrode 10 according to the first embodiment.

In the graph in FIG. 5, the horizontal axis represents a position along the gate electrode 10 in the X direction and the vertical axis represents a maximum electric field strength E [V/m] between the barrier layer 4 and the gate electrode 10 at each position. A dotted line indicates maximum electric field strength when the lower surface BS1 of the second portion 12 is inclined at a constant given angle with respect to the Z direction. A solid line indicates maximum electric field strength when the lower surface BS1 of the second portion 12 is curved so as to have a downwardly facing convex surface, as in the present embodiment.

When the semiconductor device 100 is turned off, a potential difference between the gate electrode 10 and the drain electrode 30 and a potential difference between the source electrode 20 and the drain electrode 30 generate an electric field between those electrodes. Since the distance between the gate electrode 10 and the drain electrode 30 is less than the distance between the source electrode 20 and the drain electrode 30, a stronger electric field is generated in the gate electrode 10 in the vicinity of the drain electrode 30 than in the vicinity of the source electrode 20.

As illustrated in the graph in FIG. 5, there are two peaks in the electric field strength along the interface of the gate electrode 10 and the buffer layer 4. Specifically, there is a peak (first peak) at the base of the end portion of the first portion 11 where the second portion 12 curve begins in the X direction and a peak (second peak) at the end of the lower surface BS1 of the second portion 12 in the X direction closest to the drain electrode 30. From the graph in FIG. 5, it can be understood that the maximum electric field strength at each peak is lower when the lower surface BS1 is curved than when the lower surface BS1 is inclined at a given fixed angle.

That is, according to the present embodiment, it is possible to lower the maximum electric field strength in the vicinity of the gate electrode 10 and to improve the breakdown resistance of the semiconductor device.

In FIGS. 1 to 5, the lower surface BS1 of the second portion 12 is curved to have a convex surface projecting outwardly of the main body of the gate electrode 10 into the insulation layer 40. However, the semiconductor device according to the present embodiment is not limited thereto.

Hereinafter, semiconductor devices according to modification examples of the present embodiment will be described with reference to FIGS. 6 and 7.

FIG. 6 is an enlarged sectional view illustrating the vicinity of the gate electrode 10 of a semiconductor device 110 and a graph illustrating electric field strength in the vicinity of the gate electrode 10 according to a first modification example of the first embodiment.

Figure 7:
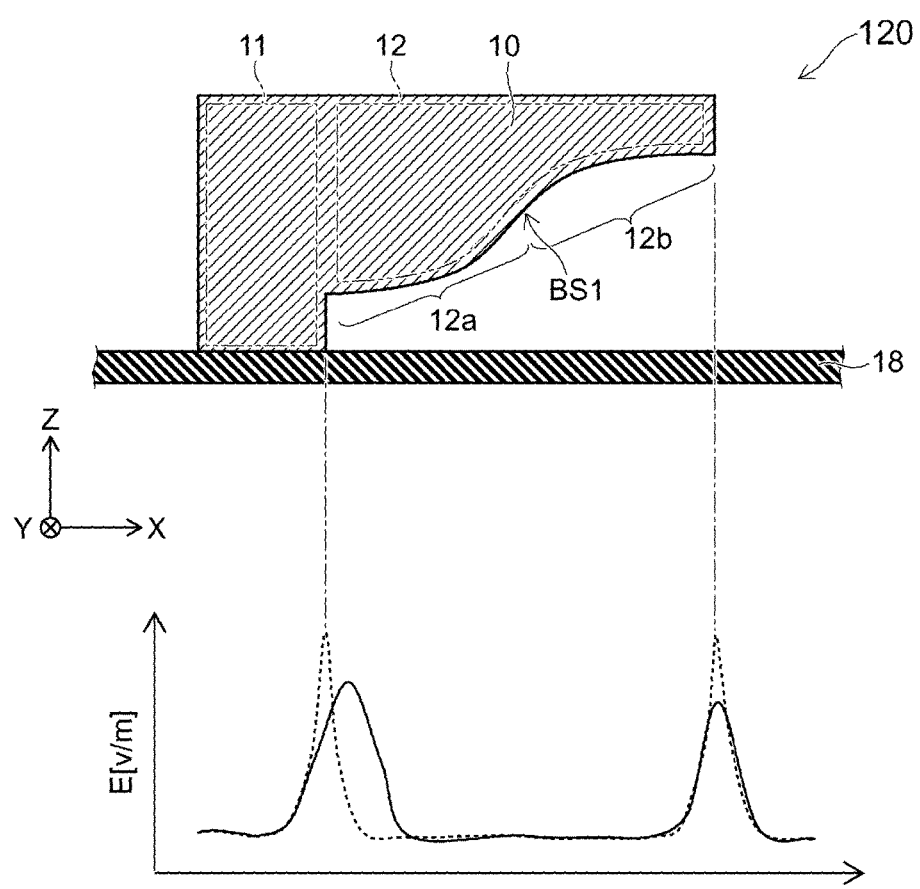
FIG. 7 is a partially enlarged sectional view illustrating the vicinity of a gate electrode of a semiconductor device and a graph illustrating electric field strength in the vicinity of the gate electrode according to a second modification example of the first embodiment.

FIG. 7 is an enlarged sectional view illustrating the vicinity of the gate electrode 10 of a semiconductor device 120 and a graph illustrating electric field strength in the vicinity of the gate electrode 10 according to a second modification example of the first embodiment.

In graphs illustrated in FIGS. 6 and 7, dotted lines indicate electric field strengths when the lower surface BS1 of the second portion 12 is inclined at a fixed given angle with respect to the Z-direction and solid lines indicate electric field strengths in the vicinity of the gate electrode 10 in the semiconductor devices according to the modification examples.

In the semiconductor device 110 illustrated in FIG. 6, the lower surface BS1 of the second portion 12 is curved so as to have a convex shape projecting into the gate electrode 10 along the interface thereof with the insulation layer 40 in the area thereof between the first portion 11 and the drain electrode 30. That is, the inclination angle of the lower surface BS1 in the Z direction becomes larger along the +Z direction. In other words, a line traced along the lower surface BS1 in the X-Z plane has a decreasing slope in the +x direction from the side of the first portion 11 to the end of the second portion 12 distal therefrom.

In this case, as illustrated in the graph in FIG. 6, the position of the first peak is moved in the +X direction (toward the drain electrode 30) and the maximum electric field strength at the first peak is lower than when the lower surface BS1 is inclined at a given fixed angle. Similarly, the position of the second peak is moved in the +X direction (toward the drain electrode 30) and the maximum electric field strength at the second peak is lower.

That is, according to the present modification example, as in the semiconductor device 100, it is also possible to lower the maximum electric field strength at the peaks and improve the breakdown resistance of the semiconductor device further than when the lower surface BS1 is inclined at a given fixed angle.

In the semiconductor device 120 illustrated in FIG. 7, the lower surface BS1 of the second portion 12 includes a first sub-portion 12a and a second sub-portion 12b. The surface BS1 of the first portion 12a extends from the first portion 11 in the direction of the drain electrode 30 and has a convex profile extending into the adjacent portions of the insulation layer 40. In other words, a line traced along the first sub-potion 12a of the lower surface BS1 in the X-Z plane has an increasing slope in the +x direction from the side of the first portion 11 to the end of the second portion 12 distal therefrom. The surface BS1 in the second sub-portion 12b extends from the first portion 11 in the direction of the drain electrode 30 and to the end of the gate electrode 10 closest to the drain electrode 30 and has a convex profile such that a portion of the insulation layer 40 projects inwardly of that portion of the second portion 12 of the gate electrode 10. In other words, a line traced along the second sub-potion 12b of the lower surface BS1 in the X-Z plane has an decreasing slope in the +x direction from the end of the first sub-portion 12a to the end of the second portion 12 distal therefrom.

In this case, as illustrated in the graph in FIG. 7, the position of the first peak is moved in the +X direction (toward the drain electrode 30) and the maximum electric field strength at the first peak and the maximum electric field strength at the second peak are lower than when the lower surface BS1 is inclined at a given fixed angle.

That is, according to the present modification example, it is also possible to improve the breakdown resistance of the semiconductor device, as in the semiconductor device 100.

When the graphs in FIGS. 5 to 7 are compared to each other, it can be understood that the maximum electric field strength at the first peak in the semiconductor device 120 is lower than in the semiconductor device 100 and the maximum electric field strength at the second peak in the semiconductor device 120 is lower than in the semiconductor device 110.

That is, according to the present modification example, it is possible to lower the maximum electric field strength at least at one of the first and second peaks and to improve the breakdown resistance of the semiconductor device further than in the semiconductor devices 100 and 110.

Hereinafter, other modification examples of the semiconductor device according to the present embodiment will be described.

FIGS. 8A to 9B are partially enlarged sectional views illustrating the vicinity of the gate electrode 10 and the interface thereof with the insulation layer 40 included in a semiconductor device according to the other modification examples of the first embodiment.

Figure 10:
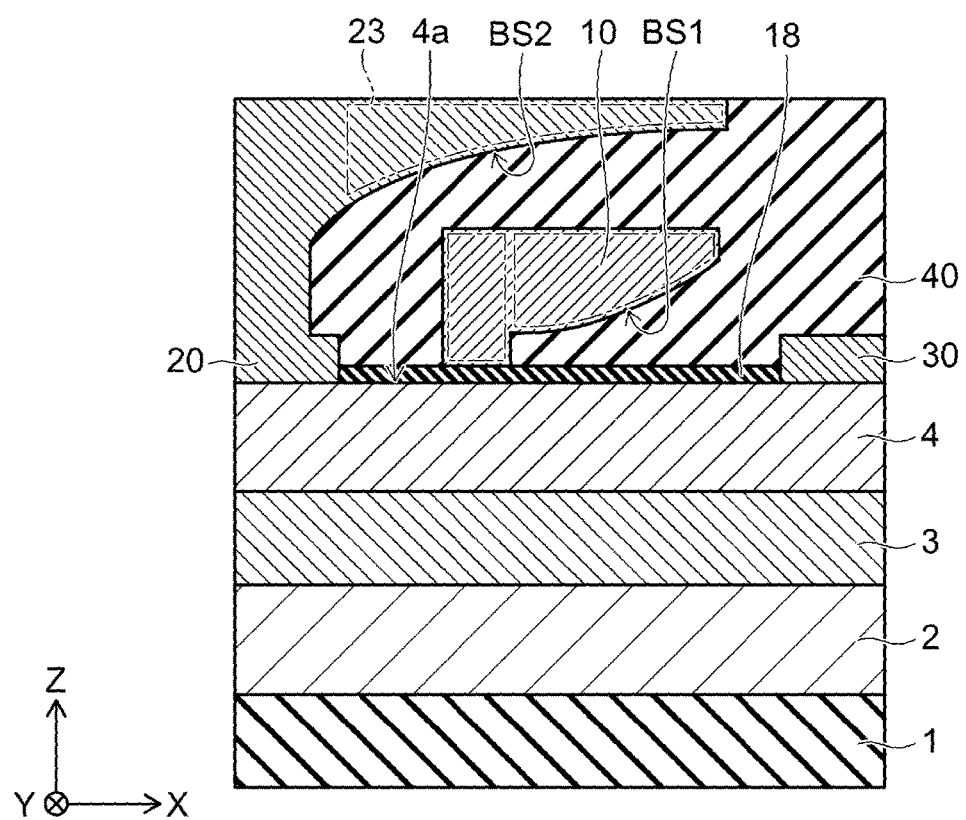
FIG. 10 is a sectional view illustrating a semiconductor device according to still another modification example of the first embodiment.

FIG. 10 is a sectional view illustrating the semiconductor device according to the other modification examples of the first embodiment.

In the following modification examples illustrated in FIGS. 8A to 10, as in the semiconductor devices 100 to 120, it is possible to lower the maximum electric field strength at the first peak and the maximum electric field strength at the second peak and to improve the pressure resistance of the semiconductor device further than when the lower surface BS1 is inclined at a given angle.

In the semiconductor device illustrated in FIG. 8A, the lower surface BS1 of the second portion 12 includes a first sub-portion 12a and a second sub-portion 12b. The first sub-portion 12a of the surface BS1 is a curved surface having a convex profile wherein the insulation layer 40 projects inwardly of the gate electrode 10. In other words, a line traced along the first sub-potion 12a of the lower surface BS1 in the X-Z plane has a decreasing slope in the +x direction from the side of the first portion 11 to the second sub-portion 12b. The second sub-portion 12b of the lower surface BS1 is a curved surface extending from the first sub-portion 12a to the end of the second portion 12 of the gate electrode 10 closest to the drain electrode 30 and has a convex profile wherein portions of the gate electrode project inwardly of the insulation layer 40. In other words, a line traced along the second sub-potion 12a of the lower surface BS1 in the X-Z plane has an increasing slope in the +x direction from the end of the first sub-portion 12a to the end of the second sub-portion 12b distal therefrom.

In the semiconductor device illustrated in FIG. 8B, an upper surface US of the second portion 12 is curved to have a convex profile extending inwardly of the upper surface of the gate electrode 10. That is, in the semiconductor devices illustrated in FIGS. 5 to 8A, the width of the second portion 12 in the Z direction decreases in the +X direction. In contrast, in the semiconductor device illustrated in FIG. 8B, the width of the second portion 12 in the Z direction is substantially constant in the X direction.

In FIG. 8B, the lower surface BS1 is likewise curved and has an outwardly, to the gate electrode 10, convex surface. However, in the semiconductor devices illustrated in FIGS. 5 to 8A, similarly, the upper surface US may be similarly curved to match the curve along each lower surface BS1 so that the width of the second portion 12 of the gate electrode 10 in the Z direction is substantially constant along the X direction. Thus in both the upper and lower surfaces BS1 and US, a line traced in the X-Z plane therealong has a positive slope from the end of the first portion 11 to the distal end of the second portion 12.

Figure 9A:
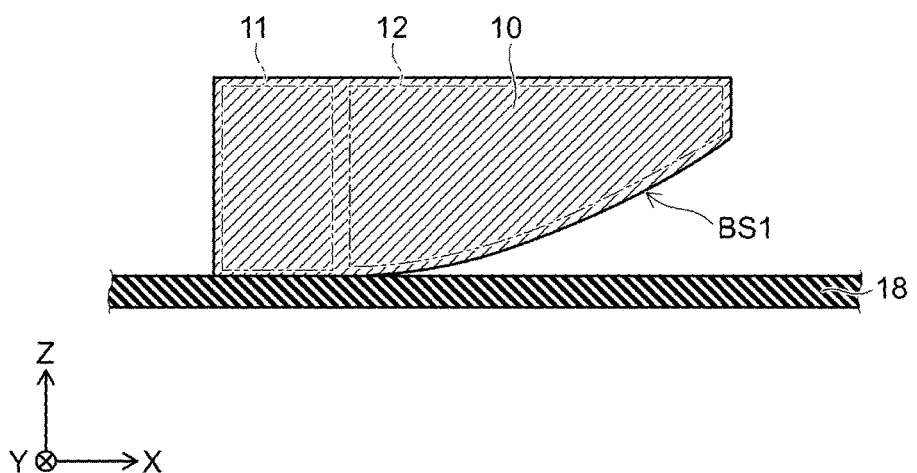
FIGS. 9A and 9B are partially enlarged sectional views illustrating the vicinity of a gate electrode included in a semiconductor device according to other modification examples of the first embodiment.

The semiconductor device illustrated in FIG. 9A is different from the semiconductor device 100 in that the lower surface BS1 of the second portion 12 is formed to smoothly extend from, or blend into, the lower surface of the first portion 11.

Figure 9B:
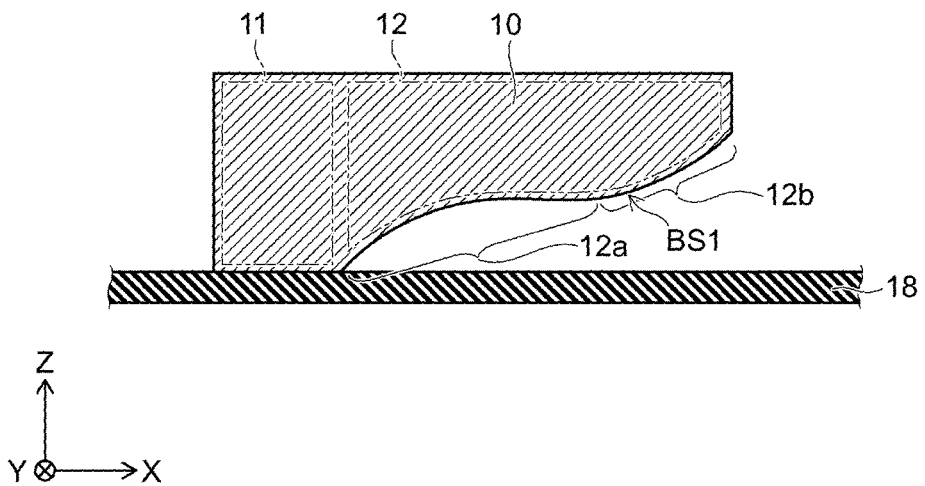

Similarly, the semiconductor device illustrated in FIG. 9B is different from the semiconductor device 120 in that the lower surface BS1 is formed to extend from lower surface of the first portion 11.

That is, in each of the semiconductor devices illustrated in FIGS. 5 to 8B, a step difference is formed between the lower surface of the first portion 11 and the lower surface BS1 of the second portion 12 of the gate electrode 10. In such semiconductor devices, each lower surface may be formed to extend from the lower surface of the first portion 11 as in the examples in FIGS. 9A and 9B.

In the semiconductor device illustrated in FIG. 10, the gate electrode 10, a portion of the source electrode 20, and the drain electrode 30 are covered with the insulation layer 40. The source electrode 20 includes a third portion 23 formed above the insulation layer 40. The third portion 23 is located over the gate electrode 10, and an end of the third portion 23 in the X direction protrudes in the +X direction more than an end of the gate electrode 10 in the +X direction.

A lower surface BS2 of the third portion 23 is curved having a convex profile projecting inwardly of the third portion 23.

When the source electrode 20 includes the third portion 23, it is possible to further lower the maximum electric field strength in the vicinity of the gate electrode 10 and further improve the breakdown resistance of the semiconductor device.

FIG. 10 illustrates the lower surface BS1 of the second portion 12 of the gate electrode 10 as a curved surface having a convex profile projecting outwardly of the second portion into the insulating layer 40. However, the lower surface BS1 may have one of the shapes illustrated in FIGS. 6 to 9B.

In the above-described first embodiment, the gate electrode 10, the source electrode 20, and the drain electrode 30 are formed above the semiconductor layer containing a nitride semiconductor, as described above. However, the present embodiment is not limited thereto, but can also be applied when the gate electrode 10, the source electrode 20, and the drain electrode 30 are formed above a semiconductor layer containing silicon. By applying the embodiment to the gate electrode formed above the semiconductor layer containing silicon, similarly, it is possible to lower the maximum electric field strength in the vicinity of the gate electrode and improve the breakdown resistance of the semiconductor device.

Second Embodiment

Next, an example of a semiconductor device according to a second embodiment will be described with reference to FIGS. 11 and 12.

In the following description, notations of $n^+$, $n^-$, $p^+$, and p indicate relative magnitude of impurity concentration in the conductivity types. That is, a notation of "+" indicates a relatively higher concentration of the impurity than a notation without the "+" or with the notation "−", and the notation "−" indicates an impurity concentration relatively lower than that of the notation without "+" or with "+".

In embodiments to be described below, p type or n type semiconductor regions may be reversed to carry out the embodiments.

An example of the semiconductor device according to the second embodiment will be described with reference to FIGS. 11 and 12.

Figure 11:
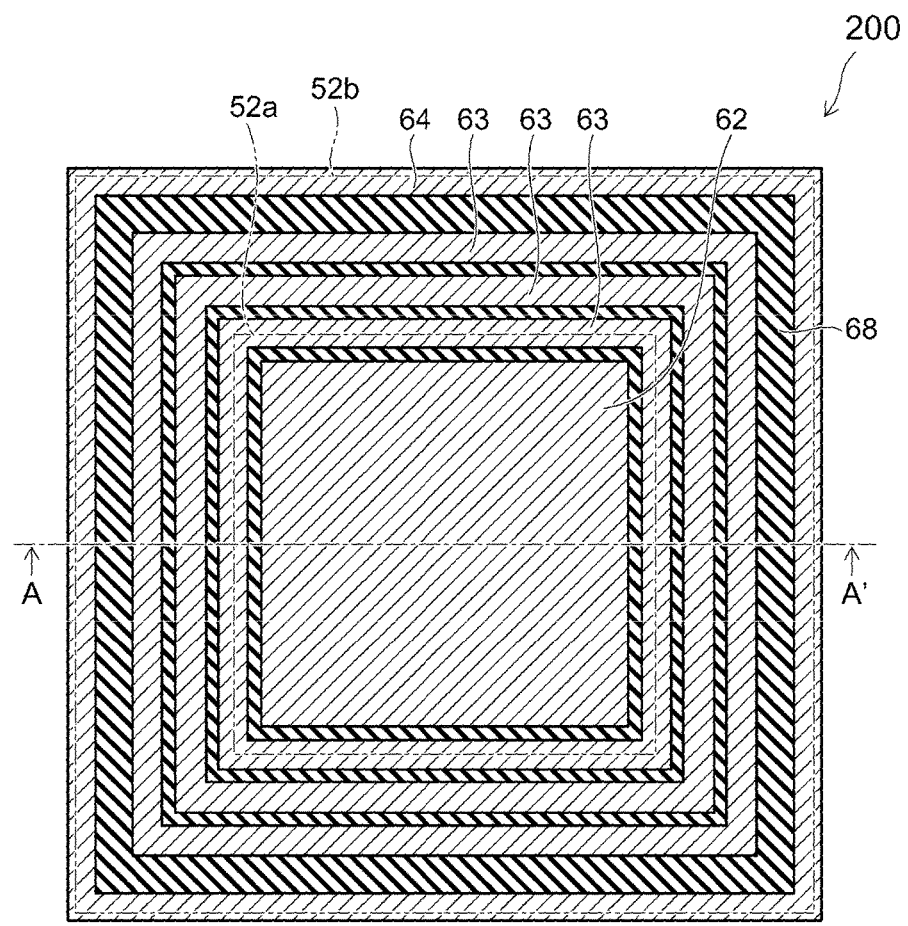
FIG. 11 is a plan view illustrating a semiconductor device according to a second embodiment.

FIG. 11 is a plan view illustrating a semiconductor device 200 according to the second embodiment.

Figure 12:
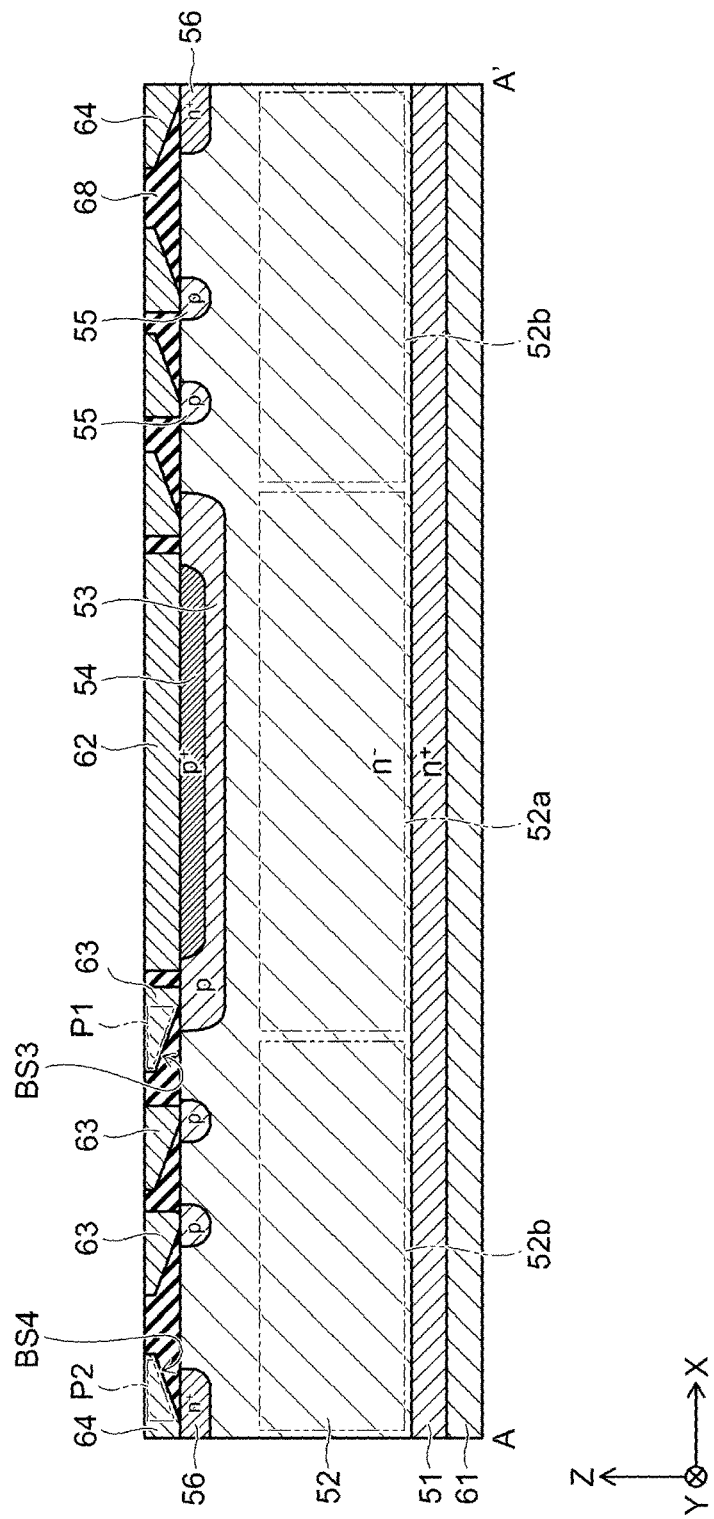
FIG. 12 is a sectional view taken along the line A-A' in FIG. 11.

FIG. 12 is a sectional view taken along the line A-A' in FIG. 11.

In FIG. 11, a first region 52a and a second region 52b included in an $n^-$ type semiconductor region 52 are indicated by a dash-dot line.

The semiconductor device 200 is a diode.

As illustrated in FIGS. 11 and 12, the semiconductor device 200 includes an $n^+$ type (first conductivity type) semiconductor region 51, an $n^-$ type semiconductor region 52 (first semiconductor region), a p type (second conductivity type) semiconductor region 53 (second semiconductor region), a $p^+$ type semiconductor region 54, p type guard ring regions 55 (third semiconductor region), an n⁺ type stopper region 56 (fourth semiconductor region), a cathode electrode 61 (first electrode), an anode electrode 62 (second electrode), field plate electrodes (hereinafter referred to as FP electrodes) 63, and a stopper electrode 64 (fourth electrode).

In the following description of the second embodiment, a direction oriented from a first region 52a to a second region 52b (a direction oriented from the center of the semiconductor device to the outside) is referred to as a first direction, and two directions included in the first direction and orthogonal to each other are referred to as the X and Y directions. A direction perpendicular to the first direction is referred to as a Z direction (second direction) and a direction oriented from the second region 52b to the first region 52a (a direction oriented from the outer circumference of the semiconductor device to the center) is referred to as a third direction.

As illustrated in FIG. 11, the anode electrode 62, the plurality of field plate (FP) electrodes 63, and the stopper electrode 64 are formed on the upper surface of the semiconductor device 200 and spaced from each other.

Each FP electrode 63 is formed in an annular form to surround the anode electrode 62.

The stopper electrode 64 is formed in an annular form to surround the plurality of FP electrodes 63.

As illustrated in FIG. 12, the cathode electrode 61 is formed on the lower surface of the semiconductor device 200.

The n⁺ type semiconductor region 51 is formed on the cathode electrode 61 and is electrically connected to the cathode electrode 61.

The n⁻ type semiconductor region 52 is formed on the n⁺ type semiconductor region 51.

As illustrated in FIGS. 11 and 12, the n⁻ type semiconductor region 52 includes a first region 52a and a second region 52b formed around the first region 52a.

As illustrated in FIG. 11, the p type semiconductor region 53 is formed on the first region 52a.

The p⁺ type semiconductor region 54 is selectively formed on the p type semiconductor region 53.

The anode electrode 62 is formed on the p type semiconductor region 53 and the p⁺ type semiconductor region 54 and is electrically connected to the p type semiconductor region 53 and the p⁺ type semiconductor region 54.

The p type guard ring regions 55 are selectively formed on the second region 52b. The plurality of p-type guard ring regions 55 are formed spaced from each other in the x-direction and y direction. Each p type guard ring region 55 is formed in an annular form to surround the p type semiconductor region 53.

The n⁺ type stopper region 56 is formed in an annular form on the second region 52b to surround the plurality of p type guard ring regions 55.

A portion, in this embodiment one, (fifth electrode) of the plurality of FP electrodes 63 is formed above the p type semiconductor region 53 spaced from the anode electrode 62 and is are electrically connected to the p type semiconductor region 53.

Another portion (third electrodes) of the plurality of FP electrodes 63 is formed above the p type guard ring region 55 and are each electrically connected to a p type guard ring region 55.

The stopper electrode 64 is formed above the n⁺ type stopper region 56 and is electrically connected to the n⁺ type stopper region 56.

An insulation layer 68 is formed between the anode electrode 62, the PF electrode 63, and the stopper electrode 64.

Any number of p type guard ring regions 55 and any number of FP electrodes 63 are used and can be appropriately changed according to the breakdown resistance necessary for the semiconductor device.

The structure above the first portion 52a of the n⁻ type semiconductor region 52 is not limited to the example illustrated in FIGS. 11 and 12, and can be modified appropriately.

Here, specific structures of the FP electrode 63 and the stopper electrode 64 will be described.

The FP electrode 63 includes a protrusion P1 protruding in the first direction. The protrusion P1 is separated from the n⁻ type semiconductor region 52, the p type semiconductor region 53, and the p type guard ring region 55 in the Z direction and a lower surface BS3 is inclined with respect to the Z direction. A distance between the lower surface BS3 and the n⁻ type semiconductor region 52 in the Z direction becomes gradually greater toward the first direction (toward the adjacent stopper electrode 64).

The stopper electrode 64 includes a protrusion P2 protruding in the first direction toward the adjacent FP electrode 63. The protrusion P2 is separated from the n⁻ type semiconductor region 52 and the n⁺ type stopper region 56 in the Z direction and a lower surface BS4 is inclined with respect to the Z direction. A distance between the lower surface BS4 and the n⁻ type semiconductor region 52 in the Z direction becomes gradually shorter in the first direction toward the adjacent FP electrode 63.

When the semiconductor device 200 is turned off, a depletion layer spreads toward the outer circumference of the semiconductor device and from the lower side of a pn junction surface between the n⁻ type semiconductor region 52 and the p type semiconductor region 53. When the p type guard ring region 55 and the FP electrode 63 are present, the depletion layer easily spreads toward the outer circumference of the semiconductor device, and thus an electric field concentration on the ends of the pn junction surface in the first direction is alleviated.

When the n⁺ type stopper region 56 and the stopper electrode 64 are formed, the depletion layer spreading toward the outer circumference of the semiconductor device can be prevented from reaching the outermost circumference of the semiconductor device.

Here, operations and advantages of the present embodiment will be described with reference to FIG. 13.

Figure 13:
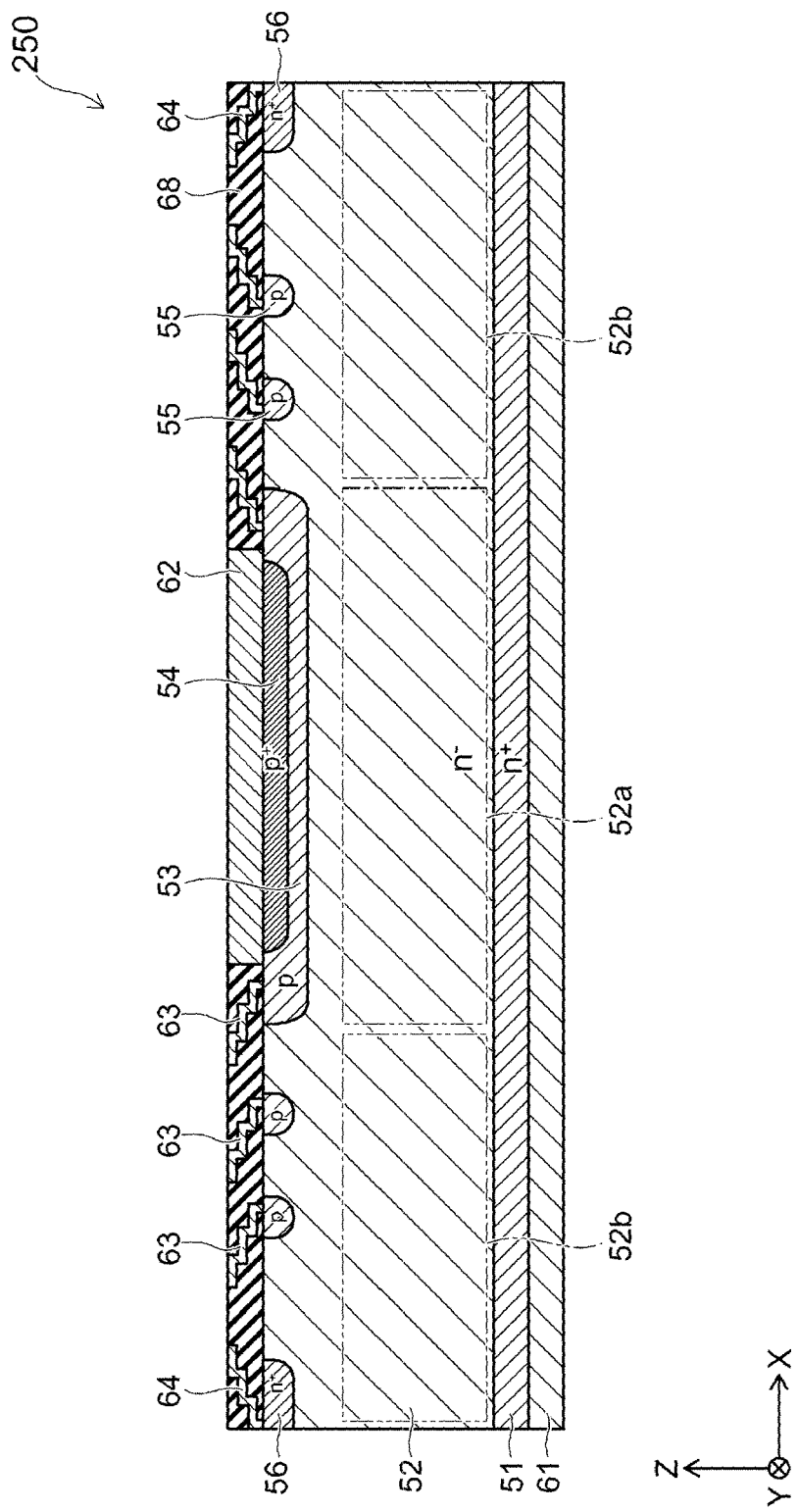
FIG. 13 is a sectional view illustrating a semiconductor device according to a reference example of the second embodiment.

FIG. 13 is a sectional view illustrating a semiconductor device 250 according to a reference example of the second embodiment.

In the semiconductor device 250, corners protruding downward are formed on the lower surfaces of protrusions of the FP electrode 63 and the stopper electrode 64.

In this case, when the semiconductor device is turned off, a depletion layer can be widened toward the outer circumference of the semiconductor device, but electric field concentration may occur in the vicinity of the above-described corners of the FP electrode 63 and the stopper electrode 64.

In contrast, in the semiconductor device 200 according to the present embodiment, the lower surfaces of the protrusions of the FP electrode 63 and the stopper electrode 64 are inclined with respect to the Z direction and these lower surfaces do not have a corner or notch. By adopting such a structure, it is possible to suppress the electric field concentration on the lower surfaces of the FP electrode 63 and the stopper electrode 64, and thus improve the breakdown resistance of the semiconductor device.

Here, the semiconductor device according to the second embodiment is a diode, as described above. However, the present embodiment can also be applied to other semiconductor devices.

Figure 14:
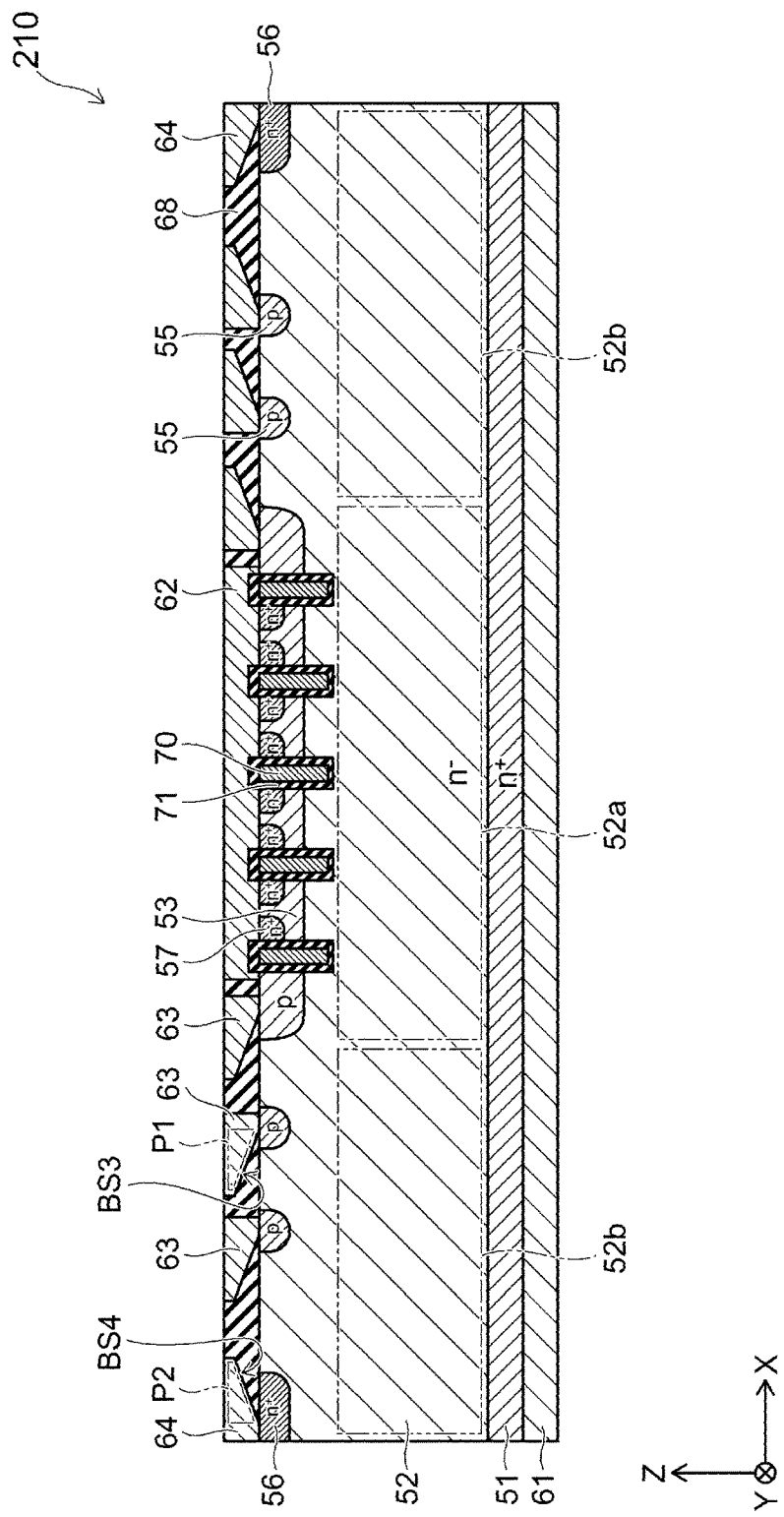
FIG. 14 is a sectional view illustrating a semiconductor device according to a modification example of the second embodiment.

FIG. 14 is a sectional view illustrating a semiconductor device 210 according to a modification example of the second embodiment.

A semiconductor device 210 is an MOSFET.

In the semiconductor device 210, an electrode 61 functions as a drain electrode and an electrode 62 functions as a source electrode.

As illustrated in FIG. 14, the semiconductor device 210 includes an n$^+$ type semiconductor region 51, an n$^-$ semiconductor region 52, p type semiconductor regions 53, p type guard ring regions 55, an n$^+$ type stopper region 56, n$^+$ type semiconductor regions 57, a drain electrode 61, a source electrode 62, FP electrodes 63, and a stopper electrode 64, gate electrodes 70, and gate insulation layers 71.

The p type semiconductor regions 53 are formed on first region 52*a*.

The n$^+$ type semiconductor regions 57 are selectively formed on the p type semiconductor regions 53 and are electrically connected to the source electrode 62.

The plurality of p type semiconductor regions 53 and the plurality of n$^+$ type semiconductor regions 57 are formed in the X direction and extend in the Y direction.

The gate electrodes 70 are extend into a portion of the n$^-$ type semiconductor region 52, and through the p type semiconductor regions 53, and the n$^+$ type semiconductor regions 57 and are spaced apart in the X-direction.

The gate insulation layers 71 are formed between the gate electrodes 70, and the n$^-$ type semiconductor region 52, the p type semiconductor regions 53, and the n$^+$ type semiconductor regions 57.

The gate insulation layer 71 is formed between the source electrode 62 and the gate electrode 70, and thus these electrodes are electrically isolated from each other.

The p type guard ring regions 55, the n$^+$ type stopper region 56, the FP electrodes 63, and the stopper electrode 64 are formed above the second region 52*b*, as in the semiconductor device 200. The lower surfaces of the protrusions of the FP electrode 63 and the stopper electrode 64 are inclined at given fixed angles with respect to the Z direction.

By adopting such a structure in the semiconductor device 210, as in the semiconductor device 200, it is possible to widen a depletion layer toward the outer circumference of the semiconductor device, alleviate electric field concentration on the FP electrode 63 and the stopper electrode 64, and improve the breakdown resistance of the semiconductor device.

Hereinafter, the semiconductor device has a trench type gate structure in which the gate electrode 70 is formed in the semiconductor region with the gate insulation layer 71 interposed therebetween, as described above. However, the present embodiment can also be applied to a semiconductor device that has a planar type gate structure in which the gate electrode 70 is formed above a semiconductor region with the gate insulation layer 71 interposed therebetween.

The present embodiment can also be applied to an insulated gate bipolar transistor (IGBT). In this case, instead of the n$^+$ type semiconductor region 51, a p$^+$ type semiconductor region is formed between the n$^-$ type semiconductor region 52 and the electrode 61.

Here, the lower surface BS3 of the FP electrode 63 and the lower surface BS4 of the stopper electrode 64 are inclined at the given angles with respect to the Z direction, as described above. However, the present embodiment is not limited thereto. The lower surfaces BS3 and BS4 may be curved as in the lower surface BS1 of the gate electrode 10 illustrated in FIGS. 1 to 9B.

For example, the lower surface BS3 may be curved so as to have a convex profile projecting away from the electrode into the adjacent insulating layer, or an opposite convex profile wherein the insulating layer projects inwardly of the electrode, as in the lower surface BS1 illustrated in FIG. 5 or 6. As in the lower surface BS1 illustrated in FIGS. 7 to 8A, a portion of the lower surface BS3 may be curved and have an inwardly projecting convex profile and another portion of the lower surface BS3 may be curved so as to have an outwardly projecting convex profile.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, the specific configurations of the elements, such as the substrate 1, the buffer layer 2, the channel layer 3, the barrier layer 4, the gate electrode 10, the gate insulation layer 18, the source electrode 20, the drain electrode 30, the insulation layer 40, the n$^+$ type semiconductor region 51, the n$^-$ type semiconductor region 52, the p type semiconductor region 53, the p$^+$ type semiconductor region 54, the p type guard ring region 55, the n$^+$ type stopper region 56, the n$^+$ type semiconductor region 57, the electrode 61, the electrode 62, the FP electrode 63, the stopper electrode 64, the gate electrode 70, and the gate insulation layer 71 included in the embodiments, can be appropriately selected from known technologies by those skilled in the art. The accompanying claims and their equivalents are intended to cover such forms or modifications as would fall within the scope and spirit of the inventions.

What is claimed is:

1. A semiconductor device, comprising:
   a first semiconductor layer;
   a first electrode above the first semiconductor layer and electrically connected to the first semiconductor layer;
   a second electrode above the first semiconductor layer and electrically connected to the first semiconductor layer, the second electrode spaced from the first electrode along the first semiconductor layer;
   a first insulating layer above the first semiconductor layer between the first and the second electrodes; and
   a third electrode including:
      a first portion including a part directly contacting the first insulating layer between the first and the second electrodes; and
      a second portion between the first portion and the second electrode, the second portion extending from the first portion in a direction towards the second electrode, wherein
   the first portion includes only portions of the third electrode that are directly above the part directly contacting the first insulating layer;
   the distance between the first semiconductor layer and a lower surface of the second portion gradually increases from the first portion to an end of the second portion that is distal to the first portion, and
   the entire lower surface of the second portion is curved.

2. The semiconductor device according to claim 1, wherein the lower surface of the second portion comprises a first sub-portion curved in an outwardly convex shape and a second sub-portion extending from the first sub-portion in the direction of the second electrode and curved in an inwardly convex shape.

3. The semiconductor device according to claim 1, wherein the lower surface of the second portion includes a first curved surface curved in an inwardly convex shape and a second curved surface extending from the first curved surface towards the second electrode and curved in an outwardly convex shape.

4. The semiconductor according to claim 1, wherein, the part of first portion directly contacting the is first insulating layer is a gate electrode.

5. The semiconductor device according to claim 1, wherein the second portion has a uniform thickness in the direction perpendicular to the surface of the first insulating layer.

6. The semiconductor device according to claim 1, further comprising:
a second insulating layer between the first insulating layer and the lower surface of the second portion, and between the lower surface of the second portion and the second electrode.

7. The semiconductor device of claim 1, wherein at the location where the second portion starts extending from the first portion, the lower surface of the second portion is spaced from the first insulating layer.

8. The semiconductor device according to claim 1, wherein at the location where the second portion starts extending from the first portion, the lower surface of the second portion is in contact with the first insulating layer.

9. The semiconductor device according to claim 1, wherein the lower surface of the second portion is curved in an outwardly convex shape from the third portion to an end of the second portion.

10. A semiconductor device, comprising:
a first conductivity type first semiconductor layer;
a first electrode on the first semiconductor layer;
a second electrode on the first semiconductor layer and spaced from the first electrode;
a first insulating layer on the first semiconductor layer between the first electrode and the second electrode; and
a third electrode between the first electrode and the second electrode, the third electrode comprising a first portion including a part directly contacting the first insulating layer and a second portion extending from the first portion toward the second electrode, the second portion spaced from the first insulating layer and having a curved surface disposed facing the first insulating layer, wherein
the first portion includes only portions of the third electrode that are directly above the part directly contacting the first insulating layer,
the distance between the first insulating layer and the curved surface of the second portion varies along the direction from the first portion towards the second electrode.

11. The semiconductor device according to claim 10, wherein the distance between the curved surface and the first insulating layer continuously increases along a direction from the first portion towards the second electrode.

12. The semiconductor device according to claim 10, wherein the curved surface further has an inwardly convex portion.

13. The semiconductor device according to claim 10, wherein the curved surface further has an inwardly concave portion.

14. The semiconductor device according to claim 10, wherein the thickness of the second portion is uniform from a first end adjacent to the first portion to a second end distal of the first end of the second portion.

15. The semiconductor device according to claim 10, wherein the entire curved surface of the second portion is outwardly convex.

* * * * *